United States Patent
Chung et al.

(10) Patent No.: US 9,281,839 B2
(45) Date of Patent: Mar. 8, 2016

(54) HARD-DECISION DECODING METHOD AND LOW-DENSITY PARITY-CHECK DECODER USING SAME

(71) Applicant: SAMSUNG ELECTRONICS CO., LTD., Suwon-si, Gyeonggi-do (KR)

(72) Inventors: Bi-Woong Chung, Yongin-si (KR); Nam-Shik Kim, Seoul (KR); Dae-Wook Kim, Osan-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 80 days.

(21) Appl. No.: 13/927,168

(22) Filed: Jun. 26, 2013

(65) Prior Publication Data

US 2014/0059401 A1  Feb. 27, 2014

(30) Foreign Application Priority Data

Aug. 27, 2012  (KR) .......................... 10-2012-0093882

(51) Int. Cl.
    *H03M 13/00* (2006.01)
    *H03M 13/11* (2006.01)
    *H04L 1/00* (2006.01)
    *H03M 13/27* (2006.01)
    *G11B 20/18* (2006.01)

(52) U.S. Cl.
    CPC .......... *H03M 13/11* (2013.01); *H03M 13/1108* (2013.01); *H04L 1/0041* (2013.01); *H04L 1/0057* (2013.01); *G11B 20/1833* (2013.01); *H03M 13/27* (2013.01)

(58) Field of Classification Search
    CPC . H03M 13/11; H03M 13/27; H03M 13/1108; H03M 13/4153; H03M 13/1102; H03M 13/458; H03M 13/1117; H03M 13/1125; H03M 13/255; H04L 1/0057; H04L 1/0041; H04L 20/1833
    USPC .................................. 714/746, 752, 786, 763
    See application file for complete search history.

(56) References Cited

U.S. PATENT DOCUMENTS

| | | | |
|---|---|---|---|
| 5,881,071 A * | 3/1999 | Kuznetsov et al. | 714/752 |
| 7,793,201 B1 | 9/2010 | Ulriksson | |
| 2004/0252791 A1* | 12/2004 | Shen et al. | 375/340 |
| 2005/0229090 A1* | 10/2005 | Shen et al. | 714/801 |
| 2006/0026486 A1* | 2/2006 | Richardson et al. | 714/758 |
| 2006/0107193 A1* | 5/2006 | Park et al. | 714/801 |
| 2006/0123318 A1* | 6/2006 | Kim et al. | 714/758 |
| 2006/0282742 A1 | 12/2006 | Zhang et al. | |
| 2008/0250300 A1* | 10/2008 | Mokhlesi et al. | 714/780 |
| 2009/0037799 A1* | 2/2009 | Liu et al. | 714/800 |
| 2009/0164540 A1 | 6/2009 | Oh et al. | |
| 2010/0037119 A1 | 2/2010 | Oh et al. | |
| 2010/0064199 A1* | 3/2010 | Branco et al. | 714/758 |
| 2010/0088575 A1* | 4/2010 | Sharon et al. | 714/763 |
| 2011/0179333 A1 | 7/2011 | Wesel et al. | |
| 2011/0239080 A1* | 9/2011 | Sakaue et al. | 714/752 |
| 2013/0061107 A1* | 3/2013 | Wang et al. | 714/752 |

* cited by examiner

*Primary Examiner* — Albert Decady
*Assistant Examiner* — Osman Alshack
(74) *Attorney, Agent, or Firm* — Volentine & Whitt, PLLC

(57) ABSTRACT

A hard-decision decoding method includes performing operations necessary for first updating of a check node while loading data, which is input to a decoder, to an input buffer; first updating the check node by using a result of the performing of the operations after storing data, corresponding to one codeword, to the input buffer; and performing low-density parity check (LDPC) decoding by using a result of the first updating of the check node.

13 Claims, 13 Drawing Sheets

HARD-DECISION DECODING METHOD AND LOW-DENSITY PARITY-CHECK DECODER USING SAME

CROSS-REFERENCE TO RELATED APPLICATIONS

This application claims the benefit of Korean Patent Application No. 10-2012-0093882 filed on Aug. 27, 2012, the subject matter of which is hereby incorporated by reference.

BACKGROUND

The inventive concept relates to decoding methods and devices using same. More particularly, the inventive concept relates to hard-decision decoding methods using a low-density, parity-check code (LDPC) and LDPC decoders using same.

Contemporary semiconductor memory systems often incorporate an error correction capability. Errors may arise in the data being read from and/or written to a data storage device in a memory system due to many different factors such as noise. Errors are routinely corrected by the use of data coding/decoding techniques. Such error detection and correction (singularly or collectively denoted as "ECC") capabilities use one or more error correction codes. Among many different error correction codes, those skilled in the art are familiar with the use of LDPC code. In general, LDPC code is an error correction code that uses a looped operations approach based on probabilities. Ongoing research seeks to improve the performance of ECC capabilities based on the use of LDPC code. Among other issues, the speed with which a constituent decoder may decode LDPC code is increasingly significant.

SUMMARY

Certain embodiments of the inventive concept provide hard-decision decoding methods that improve overall decoding performance. In particular, certain embodiments of the inventive concept provide a low-density, parity check (LDPC) decoder having improved decoding performance.

According to an aspect of the inventive concept, there is provided a hard-decision decoding method comprising; performing operations necessary for a first updating of a check node while loading data received by a decoder to an input buffer, first updating the check node using a result obtained by performing operations after loading data corresponding to one codeword to the input buffer, and then performing low-density parity check (LDPC) decoding using a result obtained by the first updating of the check node.

According to another aspect of the inventive concept, there is provided a low-density parity check (LDPC) decoder comprising; an input buffer that temporarily stores data, a pre-update processing unit that while the data received by the decoder is being loaded to the input buffer obtains first information necessary for determining a sign of information on first updating of a check node based on sign information on the data, a first update processing unit that obtains information on the first updating of the check node using the first information, and a decoding processing unit that performs LDPC decoding using the information on the first updating of the check node.

According to another aspect of the inventive concept, there is provided a memory system comprising; a nonvolatile memory device and a memory controller that controls overall operation of the nonvolatile memory device. The memory controller comprises a processor and a low-density parity check (LDPC) decoder that cooperatively operate to obtain data stored in the nonvolatile memory device. The LDPC decoder comprises; an input buffer that temporarily stores data, a pre-update processing unit that while the data received by the decoder is being loaded to the input buffer obtains first information necessary for determining a sign of information on first updating of a check node based on sign information on the data, a first update processing unit that obtains information on the first updating of the check node using the first information, and a decoding processing unit that performs LDPC decoding using the information on the first updating of the check node.

BRIEF DESCRIPTION OF THE DRAWINGS

The inventive concept will be more readily understood upon consideration of certain exemplary embodiments described in conjunction with the accompanying drawings in which.

DETAILED DESCRIPTION

Hereinafter, certain embodiments of the inventive concept will be described in some additional detail with reference to the accompanying drawings. The inventive concept may, however, be embodied in many different forms and should not be construed as being limited to only the illustrated embodiments. Rather, the embodiments are provided so that this disclosure will be thorough and complete, and will fully convey the concept of the inventive concept to those skilled in the art. It should be understood, however, that there is no intent to limit example embodiments to the particular forms disclosed, but on the contrary, example embodiments are to cover all modifications, equivalents, and alternatives falling within the scope of the inventive concept. Throughout the written description and drawings, like reference numbers and labels are used to denote like or similar elements.

The terminology used herein is for the purpose of describing particular embodiments only and is not intended to be limiting of example embodiments. As used herein, the singular forms "a," "an," and "the," are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
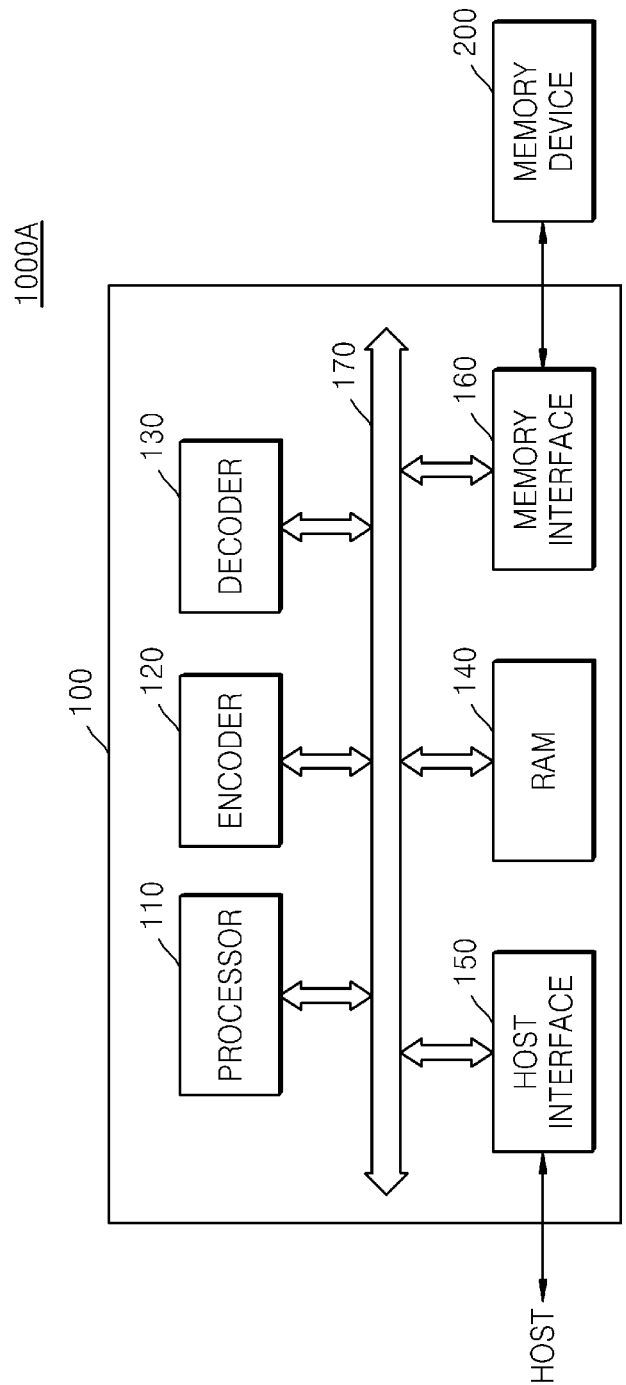
FIG. 1 is a general block diagram of a memory system according to an embodiment of the inventive concept.

FIG. 1 is a block diagram of a memory system 1000A according to an embodiment of the inventive concept. The memory system 1000A generally comprises a memory controller 100 and a memory device 200.

The memory device 200 may be implemented using one or more non-volatile memory device(s). For example, the memory device 200 may be implemented using a flash memory device, a phase change random access memory (PRAM) device, a ferroelectric RAM (FRAM) device, or a magnetic RAM (Magnetic RAM) device. The memory device 200 may also include at least one non-volatile memory device along with at least one volatile memory device, and/or multiple types of non-volatile memory devices. The memory device 200 may be implemented using a single nonvolatile memory chip or a plurality of nonvolatile memory chips.

As illustrated, the memory controller 100 comprises a processor 110, an encoder 120, a decoder 130, a RAM 140, a host interface 150, a memory interface 160, and a bus 170.

The processor 110 is connected via the bus 170 to, and controls the overall operation of, and the interoperation of, the encoder 120, the decoder 130, the RAM 140, the host interface 150, and the memory interface 160.

The bus 170 may include one or more channel(s) capable of communicating data between the memory controller 100 and one or more of the encoder 120, the decoder 130, the RAM 140, the host interface 150, and the memory interface 160.

During the control of the memory system 1000A, the processor 110 may be used to decode a "command" or instruction received from a host. For example, the processor 110 may provide the memory device 200 with a read command and corresponding address during a read operation, or with a write command, a corresponding address, and an encoded codeword during a write operation. The processor 110 may also be used to convert a logical address (LA) received from a host into a corresponding physical page address (PPA) in accordance with meta data stored in the RAM 140.

The RAM 140 may be implemented by using Dynamic RAM (DRAM), Static SRAM (SRAM), or the like. Data received from a host as well as data retrieved by the processor 110 may be temporarily stored in the RAM 140. For example, data read from the memory device 200 may also be stored in the RAM 140. Further, meta data read from the memory device 200 may be stored in the RAM 140.

Meta data is information generated by the memory system 1000A in order to manage the memory device 200. The meta data—a type of management information—generally includes mapping table information that may be used to convert a LA into a PPA associated with the memory device 200. For example, meta data may include the page mapping table information necessary to process address mapping on a page basis. Additionally, meta data may include information necessary to manage the storage area provided by the memory device 200.

The host interface 150 implements one or more data communications protocol(s) that may be used to exchange data with a host. The host interface 150 may be implemented by using such conventionally understood protocols as the advanced technology attachment (ATA) interface, serial advanced technology attachment (SATA) interface, parallel advanced technology attachment (PATA) interface, universal serial bus (USB) or serial attached small computer system (SAS) interface, small computer system interface (SCSI), embedded multi-media card (eMMC) interface, or UNIX file system (UFS). However, these specifically enumerated interfaces are only selected examples, and the inventive concept is not limited thereto. In general, the host interface 150 may exchange a command, an address, and/or data with the host under the control of the processor 110.

Similarly, the memory interface 160 may be used to connect the memory device 200 with the memory system 1000A. For example, the memory interface 160 may be configured to support an interface with a negative-AND (NAND) flash memory chip or a negative-OR (NOR) flash memory chip. The memory interface 160 may be configured to selectively perform software and/or hardware interleave operations via a plurality of channels.

When power is applied to the memory system 1000A, the processor 110 controls the memory system 1000A to read meta data stored in the memory device 200 and/or meta data stored in the RAM 140. The processor 110 then controls the memory system 1000A to update the meta data stored in the RAM 140 according to the meta data read from the memory device 200. Additionally, the processor 110 may be used to control the memory system 1000A to write (or update) meta data stored in the RAM 140, or meta data stored in the memory device 200 before powering-off the memory system 1000A.

The processor 110 and encoder 120 may be used to control the overall operation of the memory controller 100 in such a manner as to implement LDPC encoding of "write data" (or "information word") received from the host during a write operation based on one or more codeword(s), (hereafter for the sake of simplicity, "codeword"). In analogous manner, the processor 110 and decoder 130 may be used to control the overall operation of the memory controller 100 in such a manner as to implement LDPC decoding of "read data" retrieved from the memory device 200 during a read operation.

The encoder 120 may generate a codeword by adding a plurality of parity bits specified by LDPC code to an "information word" received from the host. If the number of bits of the codeword is assumed to be "N" and the number of bits of the information word is assumed to be "K", then each parity bit of the LDPC codeword is set to meet the given LDPC code.

The decoder 130 performs LDPC decoding of read data using the codeword to restore the information word.

The particular "LDPC codes" may be conceptually represented by a bipartite graph commonly referred to as a tanner graph. In a tanner graph, an "edge" is said to connect a "variable node" to only a "check node". The edge may neither connect a variable node to another variable node, nor a check node to another check node. The set of nodes in this type of graph include these variable nodes and correspond to a set of bits and different nodes of a codeword. Check nodes (or "constraint nodes") correspond to a set of parity check constraints that define a codeword.

The decoder 130 performs a pre-update operation necessary for a first updating of a check node while storing data, which is input for decoding, to an internal input buffer, and updates the first check node using the result of the pre-update operation after storing data corresponding to one codeword to the input buffer. Additionally, the decoder 130 may be used to perform LDPC decoding using the result of the first updating of the check node.

As an example, the decoder 130 may store data input for decoding to an "input buffer" and simultaneously performs a pre-update operation on information necessary to determine a sign of the information on the first updating of the check node.

Additionally, the decoder 130 may be used to obtain the sign of information on the first updating of the check node based on information resulting from the pre-update operation. Then, the decoder 130 may determine information for the first updating of the check node using a value obtained by integrating the obtained sign with default magnitude information.

The decoder 130 may determine the sign of the information for the first updating of the check node using a value obtained (e.g.,) by performing an exclusive-OR (XOR) operation of the sign information on a variable node connected to each check node and first information on a corresponding check node. The term "first information" refers to information obtained by performing a pre-update XOR operation for each check node of the sign information on all variable nodes connected to each check node.

As an example, the decoder 130 first updates a variable node using the result of the first updating of the check node, and performs decoding based on the result of the updating of the variable node. Then, if an error is detected as the result of the decoding, the decoder 130 repeatedly updates the check node and the variable node and again performs decoding.

As another example, the decoder 130 first updates the variable node using the result of the first updating of the check node. Then, the decoder 130 sequentially updates a check node and a variable node and performs decoding based on the result of the sequentially performed updates of the variable node. Then, if an error is detected as the result of the decoding, the decoder 130 repeatedly updates a check node and a variable node and again performs decoding.

Figure 2:
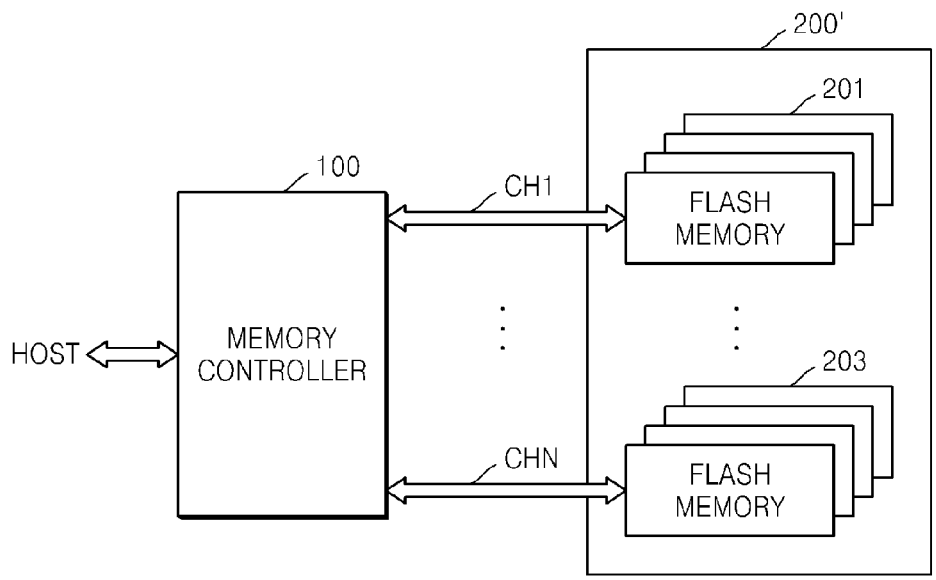
FIG. 2 is a block diagram illustrating a memory system according to another embodiment of the inventive concept.

FIG. 2 is a block diagram illustrating a memory system capable of implementing a plurality of channels and ways for the memory device 200 of FIG. 1 using a plurality of non-volatile (e.g., flash) memory chips. In certain embodiments of the inventive concept, a solid state drive, or solid state disc (SSD) may be implemented using a memory system 1000B of FIG. 2.

Thus, the memory device 200' in the memory system 1000B of FIG. 2 is assumed to incorporate a plurality of flash memory chips (201, 203). In one configuration example, the memory system 1000B includes "N" channels including (e.g.,) four (4) flash memory chips per channel. However, the number of the flash memory chips per channel may be variously configured. The memory controller 100 of FIG. 2 may be configured to be substantially identical to the memory controller 100 of FIG. 1.

Figure 3:
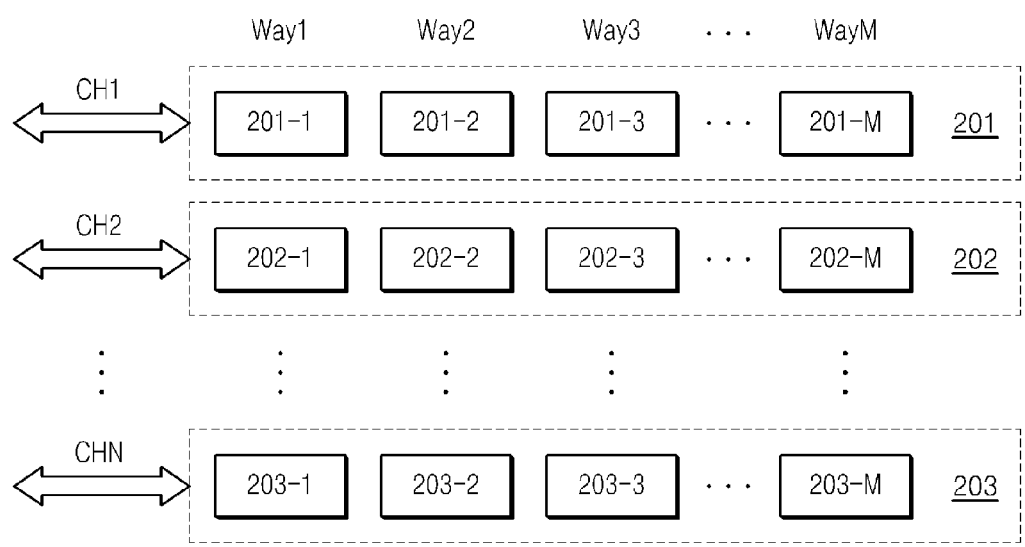
FIG. 3 is a conceptual diagram of an exemplary configuration of channels and ways that may be used in the memory systems of FIGS. 1 and 2.

FIG. 3 further illustrates one particular example of channels and ways that may be incorporated into the memory system 1000B of FIG. 2.

Respective channels through CH1 to CHN are used to connect a respective plurality of flash memory chips 201 through 203. The respective channels CH1 through CHN may include independent buses capable of communicating commands, addresses, and data between the corresponding flash memory chips 201 through 203. The flash memory chips connected to respectively different channels may operate independently. The plurality of memory chips 201, 202, and 203 form a plurality of ways Way1 to WayM, such that M ways formed in each channel are connected to M flash memory chips.

For example, the flash memory chips 201 may form M ways Way1 through WayM in a No. 1 channel CH1. The M ways Way1 through WayM in the channel CH1 may be respectively connected to flash memory chips 201-1 through 201-M. Such relationship of forming ways and channels between flash memory chips and respective ways and channels may also be applied to the flash memory chips 202 and 203.

A way is a unit that may be used to further designate flash memory chips that share the same channel. Hence, respective flash memory chips may be particularly identified in a matrix formed by channels and ways. The channel and way associated with a flash memory chip may be used during the execution of a request received from a host providing a logical address.

Figure 4:
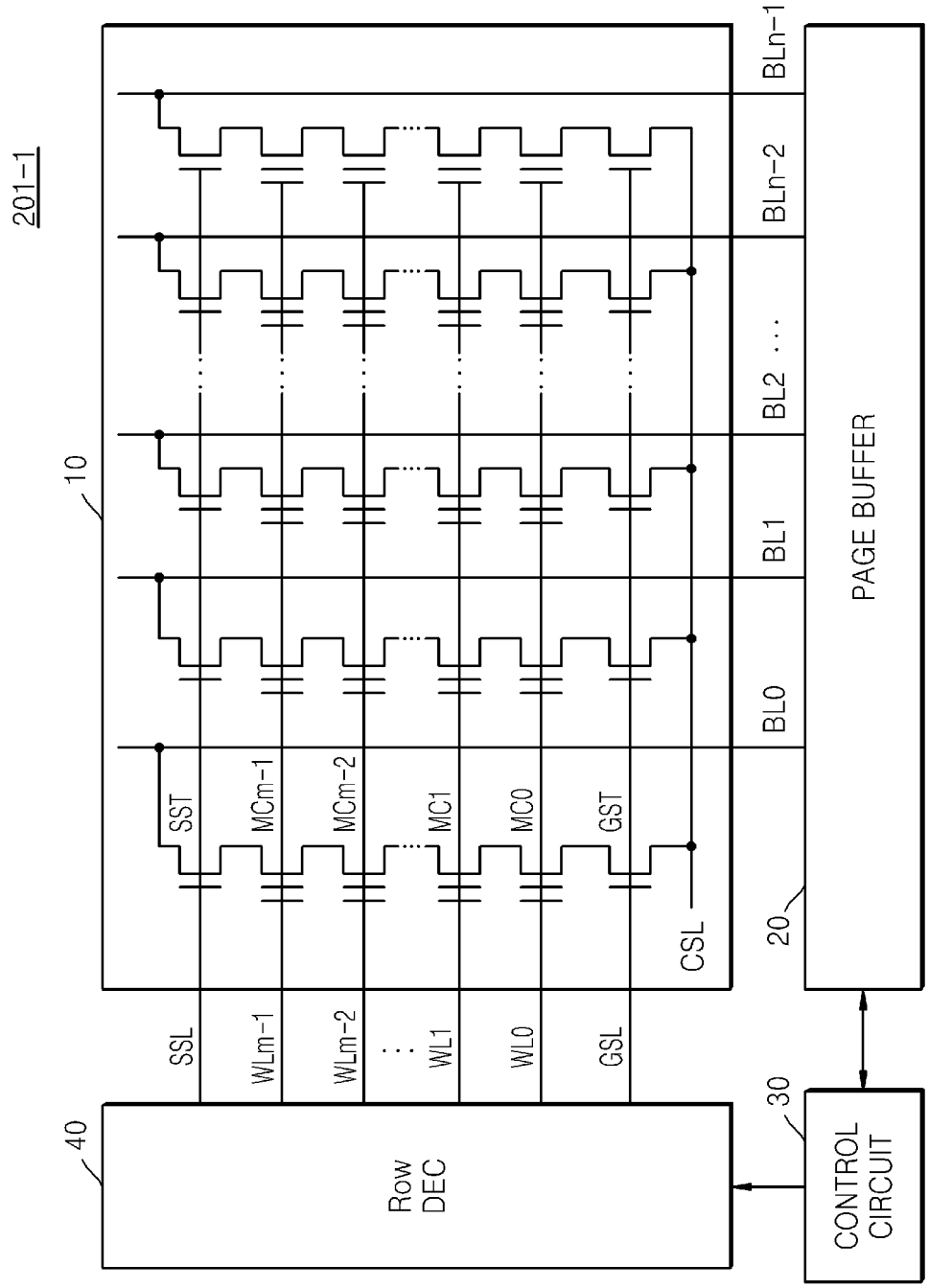
FIG. 4 further illustrates an exemplary flash memory chip that may be used as a memory device in the memory systems of FIGS. 1 and 2.

FIG. 4 further illustrates an exemplary circuit configuration for a flash memory chip 201-1 included in the memory device 200' of FIG. 3.

Referring to FIG. 4, the flash memory chip 201-1 includes a memory cell array 10, a page buffer 20, a control circuit 30, and a row decoder 40.

The memory cell array 10 is an area to which data is written by applying a predetermined voltage to a transistor. The cell array 10 includes memory cells in which word lines WL0 through WLm−1 and bit lines BL0 through BLn−1 cross each other. 'm' and 'n' herein are natural numbers. FIG. 4 illustrates a relevant portion of one memory block. However, the cell array 10 may include a plurality of memory blocks. Each memory block includes pages which correspond respectively to the word lines WL0 through WLm−1. The pages respectively include a plurality of memory cells connected to a corresponding word line. The flash memory chip 201-1 performs an erase operation for each block and also executes program operation or a read operation for each page.

The memory cell array 10 has a structure of cell strings. Each cell string includes a string selection transistor SST connected to a string selection line SST, a plurality of memory cells MC0 through MCm−1 respectively connected to a plurality of word lines WL0 through WLm−1, and a ground selection transistor GST connected to a ground selection line GSL. The string selection transistor SST is connected to between a bit line and a string channel, and the ground selection transistor GST is connected to between the string channel and a common source line CSL.

The page buffer 20 is connected to the cell array 10 via the plurality of bit lines BL0 through BLn−1. The page buffer 20 temporarily stores data to be written to the memory cells which are connected to the selected word line or data read from the memory cells connected to the selected word lines.

The control circuit 30 generates various voltages necessary for program operation, an read operation, or an erase operation, and controls various operations of the flash memory chip 201-1.

The row decoder 40 is connected to the cell array 10 via selected lines SSL and GLS and the plurality of word lines WL0 through WLm−1. The row decoder 40 receives an address which is input during a program operation or a read operation, and selects a word line according to the input address. The selected word line herein is connected to memory cells in which a program operation or a read operation is to be performed.

Additionally, the row decoder 40 applies voltages necessary for a program operation or a read operation to a selected word line, non-selected word lines, and the selected lines SSL and GSL. The necessary voltages include, for example, a program voltage, a path voltage, a read voltage, a string selection voltage, and a ground selection voltage.

Each memory cell may store data of one or more bits. A memory cell which stores one bit in one cell is called a single level cell (SLC). Additionally, a memory cell which stores two or more bits in one memory cell is called a multi-level cell (MLC). The single level cell has an erase state or a program state according to a threshold voltage.

Figure 5:
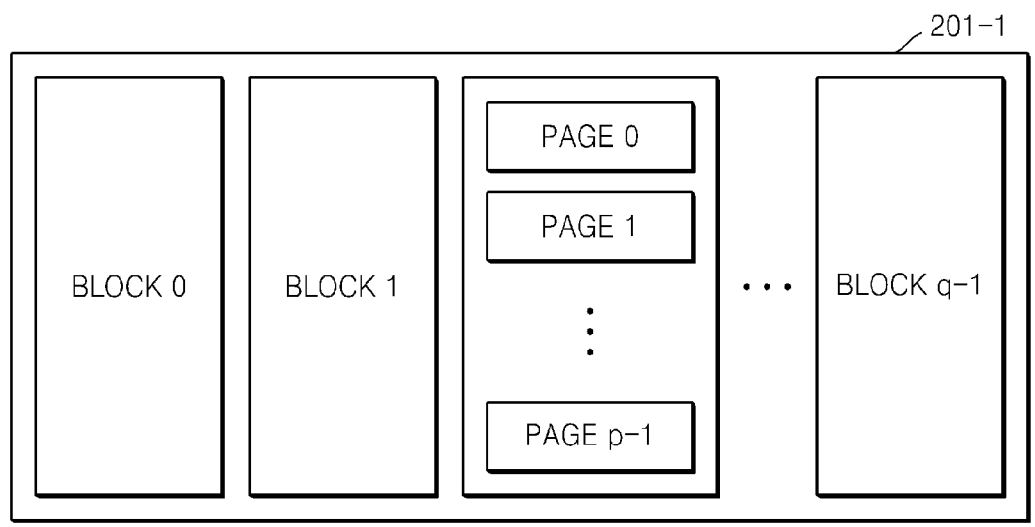
FIG. 5 is a general block diagram illustrating one possible internal storage structure for the flash memory chip of FIG. 4.

As further illustrated in FIG. 5, the internal structure of the flash memory chip 201-1 may include a plurality of blocks, wherein each block includes a plurality of pages.

Data is written to and read from the flash memory chip 201-1 for each page, and electrical erasing of data is executed for each block. Additionally, electric erasing of data in a block is necessary prior to writing data. Therefore, overwriting is not available.

A user is not able to write user data in a physical area of a memory device in which overwriting is unavailable. Accordingly, when an access is requested to read or write data from a host, an address conversion operation is necessary to convert a logical address, which is an area in which a read or write is requested, into a physical page address, which is a physical area in which data is to be stored.

Figure 6:
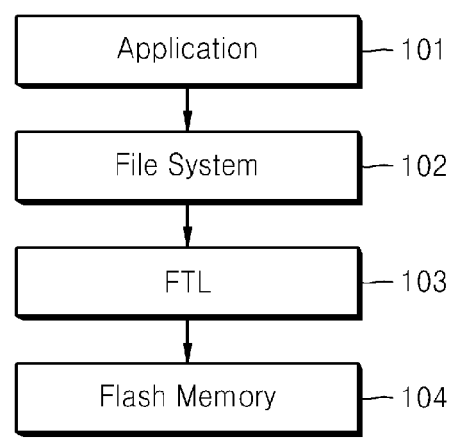
FIG. 6 is a diagram illustrating a software hierarchy that may be used by the processor in FIG. 1.

Referring now to FIG. 6, an exemplary process of converting a logical address into a corresponding physical page address in the memory system 1000A or 1000B will be described.

FIG. 6 illustrates one possible software structure for the memory system 1000A or 1000B. As an example, FIG. 6 shows a software structure in case that the memory device 200 is implemented by the flash memory.

Referring to FIG. 6, the memory system 1000A or 1000B has a software hierarchical structure which includes an application layer 101, a file system layer 102, a flash translation layer (FTL) 103, and a flash memory layer 104 in sequence.

The application layer 101 refers to firmware for processing data in response to a user input from a host. The application layer 101 processes user data in response to a user input, and transmits a command, for storing the processed user data in a flash memory chip, to the file system layer 102.

The file system layer 102 allocates a logical address for storing the user data, in response to the command transmitted from the application layer 101. Types of the file system 102 include a file allocation table (FAT) system, a new technology file system (NTFS), and so on.

The FTL 103 converts a logical address transmitted from the file system layer 102 into a physical page address for read and write operations in a flash memory chip. The FTL 103 may convert the logical address into the physical page address by using mapping information included in meta data. An address conversion operation at the FTL 103 may be performed in the processor 110 of the memory controller 100.

The flash memory layer 104 generates control signals to store or read data by accessing the physical page address converted into the logical address.

Hereinafter, an "inventive decoding scheme" (e.g., a decoding approach consistent with an embodiment of the inventive concept) will be described in the context of the memory system 1000A and memory controller 100 of FIG. 1. In one view, the inventive decoding scheme may be understood as a type of hard-decision, normalized, min-sum decoding approach.

Figure 7:
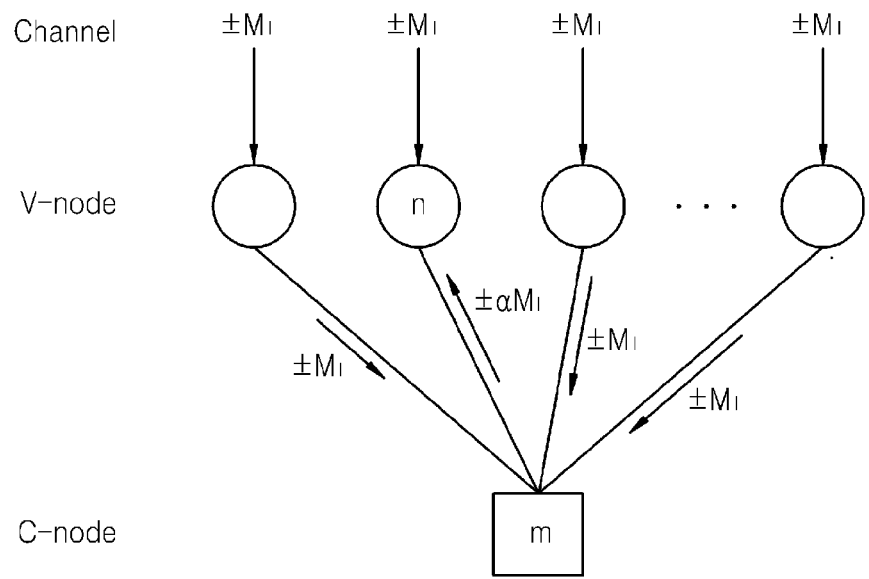
FIG. 7 is a bipartite graph illustrating one approach that may be used to update a check node during low-density, parity check (LDPC) decoding according to an embodiment of the inventive concept.

FIG. 7 is a bipartite graph that will assist in the understanding of the so-called "first updating of a check node" described above in the LDPC decoding provide by the inventive decoding scheme.

Referring to FIG. 7, only one check node (C-node) "m" is shown for simplicity of explanation. Each variable node (V-node) is connected to the C-node. For example, one channel may be a path used to receive a value for each bit of a codeword. The value "Fn" below is a determination result of a signal "y" that is input for decoding. The value "Fn" may be obtained as shown below, where "$M_I$" represents a value of a long-likelihood ratio (LLR) for the input signal:

$$F_n = \ln\frac{f_n^1}{f_n^0} \implies F_n = \pm M_I$$

Further, a variable node message "Zmn" used during initialization may be expressed as:

$$z_{mn} = F_n \implies z_{mn} = \pm M_I$$

Still further, a variable node message "Lmn" used during the updating of the check node may be expressed as shown below, where "$\sigma_m$" is a value obtained by performing an XOR operation of signs for all variable nodes connected to a check node "m", "$\sigma_{mn}$" is a value of a sign of a variable node "n" connected to the check node "m", and "α" is a normalizing constant:

$$L_{mn} = (-1)^{\sigma_m \oplus \sigma_{mn}} \cdot \left[\alpha \cdot \min_{n' \in N(m)\backslash n} |z_{mn'}|\right]$$

Referring to FIG. 7, if the first updating of the check node is performed, messages of all the variable nodes have the same value. Accordingly, if the first updating of the check node is performed, a check node message Lmn may be expressed as:

$$L_{mn} = (-1)^{\sigma_m \oplus \sigma_{mn}} \cdot [\alpha \cdot M_I]$$

The variable node message "Zmn" for updating a variable node may be expressed as:

$$z_{mn} = F_n + \sum_{m' \in M(n) \setminus m} L_{m'n}$$

Additionally, information "Zn" on a tentative decoded variable node "n" may be expressed as:

$$z_n = F_n + \sum_{m \in M(n)} L_{mn}$$

The formula above for the check node message "Lmn" according to the first updating of the check node may be expressed including a sign and a magnitude. The sign and the magnitude of this formula may be specifically expressed as:

$$L_{mn} = \underbrace{(-1)^{\sigma_m \oplus \sigma_{mn}}}_{sign} \cdot \underbrace{[\alpha \cdot M_l]}_{magnitude}$$

Referring to the immediately foregoing formula, as a default fixed value may be used as the magnitude value, an area for storing the magnitude value of the first updating of the check node is necessary.

As "$\sigma_m$" is a value obtained by performing an XOR operation of a sign of all variable node connected to the check node "m", an area for storing a bit for each check node is necessary. As "$\sigma_{mn}$" is a value of a sign of a variable node "n" connected to the check node "m", information on the first updating of the check node is hard-decision information that may be input by the decoder 130. Therefore, a value stored in the input buffer may be used and an additional storage area is not necessary.

Figure 8:
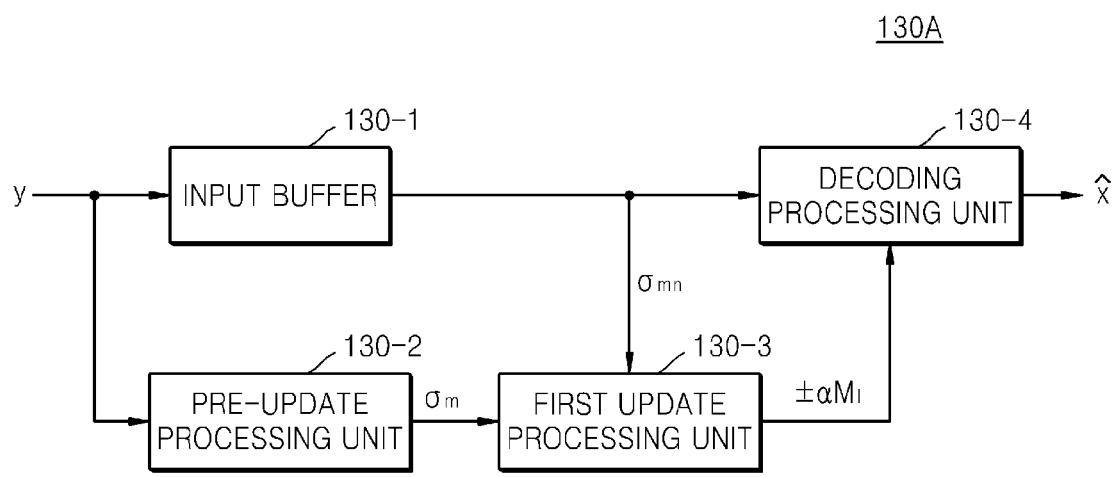
FIG. 8 is a block diagram further illustrating the LDPC decoder 130 of FIG. 1.

FIG. 8 is a block diagram illustrating one possible example of the decoder 130 of FIG. 1. As illustrated in FIG. 8, the LDPC decoder 130A according to an embodiment of the inventive concept, includes an input buffer 130-1, a pre-update processing unit 130-2, and a first update processing unit 130-3, and a decoding processing unit 130-4.

A codeword "y" read from the memory device 200 is loaded to the input buffer 130-1. A value of each bit which forms the codeword corresponds to hard-decision information.

The pre-update processing unit 130-2 obtains first information necessary for determining a sign of information on the first updating of a check node based on sign information of each bit in the codeword, while the codeword "y" is being loaded to the input buffer 130-1. For example, the first information may be obtained by performing an XOR operation of sign information on all variable nodes connected to each check node. As an example, the first information on the check node "m" may be expressed as "$\sigma_m$".

The first update processing unit 130-3 generates second information by performing an XOR operation of sign information on variable nodes connected to each check node and the first information on the corresponding check node. Then, the first update processing unit 130-3 generates information on the first updating of the check node based on second information. As an example, the first update processing unit 130-3 may determine a sign of information on the first updating of the check node based on second information, and generate information on the first updating of the check node by integrating the determined sign with default magnitude information.

As an example, when first updating of a check node is performed, sign information "$\sigma_{mn}$" on the variable node "n", which is connected to the check node "m" may be obtained from the input buffer 130-1. That is, the sign information of the variable node "n" is a bit value of an input codeword "y" which corresponds to the variable node "n". Additionally, the bit value of the codeword y corresponds to hard-decision information. For example, the hard-decision information may be expressed as a data value "0" or "1".

Accordingly, when first updating of a check node is performed, sign information "$\sigma_{mn}$" on a variable node "n" connected to a check node "m" may be obtained by reading a bit value which corresponds to the variable node "n" in the codeword "y" stored in the input buffer 130-1.

Additionally, as the first information on the check node "m" is already obtained by the pre-update processing unit 130-2, second information may be obtained by performing an XOR operation of "$\sigma_m$" and "$\sigma_{mn}$". Accordingly, referring to the formula above, the sign of information "Lmn" on the first updating of the check node may be determined based on the second information. A default fixed value may be used as size information [$\alpha \cdot M_l$] on the information "Lmn" on the first updating of the check node.

Using the operations described above, the first update processing unit 130-3 may obtain the information "Lmn" on the first updating of the check node.

The decoding processing unit 130-4 executes LDPC decoding using the information on the first updating of the check node which is obtained at the first update processing unit 130-3.

As an example, the decoding processing unit 130-4 performs first updating of a variable node using the result of the first updating of the check node, and performs decoding based on a result of the first updating of the variable node. Then, if it is determined that an error occurs as the result of decoding, the decoding processing unit 130-4 repeatedly performs the updating of the check node and the variable node and then again performs decoding. If it is determined that an error does not occur, the decoding processing unit 130-4 outputs a decoded codeword X̂.

As another example, the decoding processing unit 130-4 performs first updating of a variable node by using a result of the first updating of the check node, and sequentially performs updating of the check node and the variable node. Then, the decoding processing unit 130-4 performs decoding based on a result of the sequentially updating of the variable node. If it is determined that an error occurs as a result of the decoding, the decoding processing unit 130-4 repeatedly performs updating of the check node and the variable node and then, executes decoding again. If it is determined that an error does not occur as a result of the decoding, the decoding processing unit 130-4 outputs a decoded codeword X̂.

Figure 9:
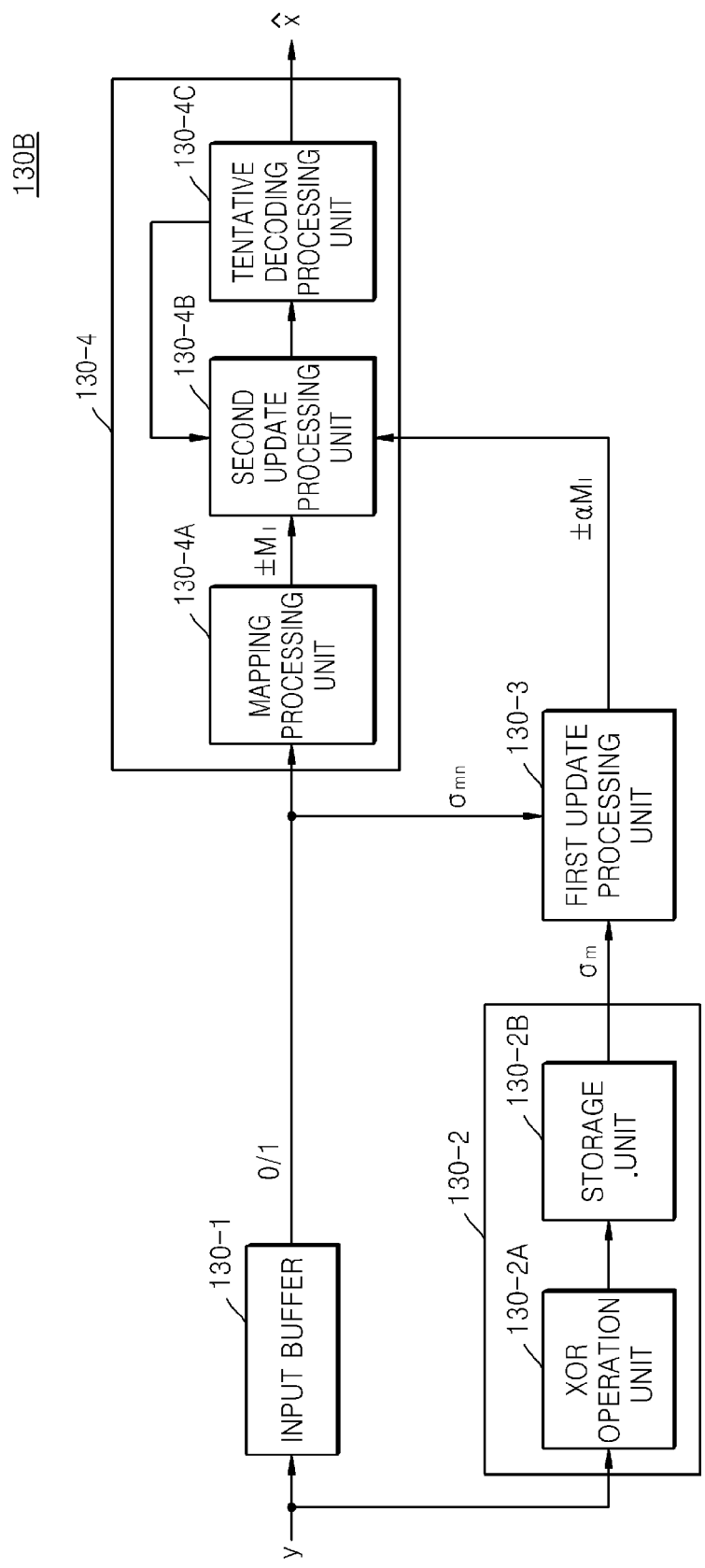
FIG. 9 is a block diagram further illustrating the pre-update processing unit 130-2 and decoding processing unit 130-4 of the LDPC decoder 130A of FIG. 8.

FIG. 9 further illustrates in some additional detail the pre-update processing unit 130-2 and the decoding processing unit 130-4 of the LDPC decoder 130A shown in FIG. 8.

As illustrated in FIG. 9, the LDPC decoder 130B, according to an embodiment of the inventive concept, includes the input buffer 130-1, the pre-update processing unit 130-2, and the first update processing unit 130-3, and the decoding processing unit 130-4.

Referring to FIG. 9, the pre-update processing unit 130-2 includes an XOR operation unit 130-2A and a storage unit 130-2B. The decoding processing unit 130-4 includes a mapping processing unit 130-4A, a second update processing unit 130-4B, and a tentative decoding processing unit 130-4C.

According to an embodiment of the inventive concept, the mapping processing unit 130-4A is disposed in the decoding processing unit 130-4. However, in other embodiments of the inventive concept, the mapping processing unit 130-4A may be disposed outside the decoding processing unit 130-4.

A codeword y read from the memory device 200 is loaded to the input buffer 130-1. A value of each bit which forms the codeword y corresponds to hard-decision information.

The XOR operation unit 130-2A obtains first information by performing an XOR operation, for each check node, of sign information of all variable nodes connected to each check node. The first information herein is necessary for determining a sign of information on first updating of a check node. As an example, the first information on the check node "m" may be expressed as "$\sigma_m$".

The first information processed at the XOR operation unit 130-2A is stored in the storage unit 130-2B. The storage unit 130-2B may be implemented by using a memory or a register which has a capacity of storing one bit for each check node.

Accordingly, while the codeword "y" is being loaded to the input buffer 130-1, the first information is obtained and stored in the storage unit 130-2B.

After storing at least one codeword "y" in the input buffer 130-1, the first update processing unit 130-3 generates second information by performing an XOR operation of sign information on variable nodes connected to each check node and the first information on the corresponding check node. Then, the first update processing unit 130-3 generates information on the first updating of the check node based on the second information.

The first update processing unit 130-3 reads sign information "$\sigma_{mn}$" on a variable node connected to each node from the input buffer 130-1 and reads and obtains first information "$\sigma_m$" on the corresponding check node from the storage unit 130-2B. Additionally, second information may be generated based on a result by performing an exclusive OR operation on "$\sigma_m$" and "$\sigma_{mn}$".

The first update processing unit 130-3 may determine a sign of information on first updating of a check node based on the second information, and generate the information on the first updating of the check node by integrating default magnitude information with the determined sign. As an example, the first check node update information Lmn may be obtained by using Formula 7. In Formula 7, a default fixed value may be used for [$\alpha \cdot M_I$].

Accordingly, the information Lmn on the first updating of the check node obtained at the first update processing unit 130-3 is $+\alpha M_I$ or $-\alpha M_I$.

The mapping processing unit 130-4A outputs a default LLR value which corresponds to information read from the input buffer 130-1 for updating a variable node or a check node. The information read from the input buffer 130-1, which is hard-decision information, is expressed as a data value of "0" or "1". Additionally, the default LLR value may be determined as $+M_I$ or $-M_I$.

As an example, if the information read from the input buffer 130-1 is 0, the mapping processing unit 130-4A may output $-M_I$. If the information read from the input buffer 130-1 is 1, the mapping processing unit 130-4A may output $+M_I$. As another example, if the information read from the input buffer 130-1 is 0, the mapping processing unit 130-4A may output $+M_I$, and if the information read from the input buffer 130-1 is 1, the mapping processing unit 130-4A may output $-M_I$.

The second update processing unit 130-4B generates information on first updating of a variable node by performing an operation according to the above formula using an LLR value which is output from the mapping processing unit 130-4A and the information "Lmn" on the first updating of the check node which is output from the first update processing unit 130-3. As noted above, "Fn" is an LLR value which is output from the mapping processing unit 130-4A with regard to information received via a channel which corresponds to the variable node "n".

When an error determination signal is input from the tentative decoding processing unit 130-4C, the second update processing unit 130-4B performs an operation for generating check node update information and variable node update information in sequence. As an example, the second update processing unit 130-4B may perform an operation such as the calculation of "Lmn" noted above so as to generate information on updating of a check node, and perform an operation to generate information on updating of a variable node.

The tentative decoding processing unit 130-4C performs tentative decoding based on a result of updating at the second update processing unit 130-4B. Additionally, the tentative decoding processing unit 130-4C performs a syndrome check process for a tentative-decoded codeword $\hat{X}$. Then, if it is determined that an error occurs, the tentative decoding processing unit 130-4C generates an error determination signal, and outputs the signal to the second update processing unit 130-4B. If the tentative decoding processing unit 130-4C performs a syndrome check process for a tentative-decoded codeword $\hat{X}$, and it is determined that an error does not occur, the decoded codeword $\hat{X}$ is output as a result of the decoding.

Figure 10:
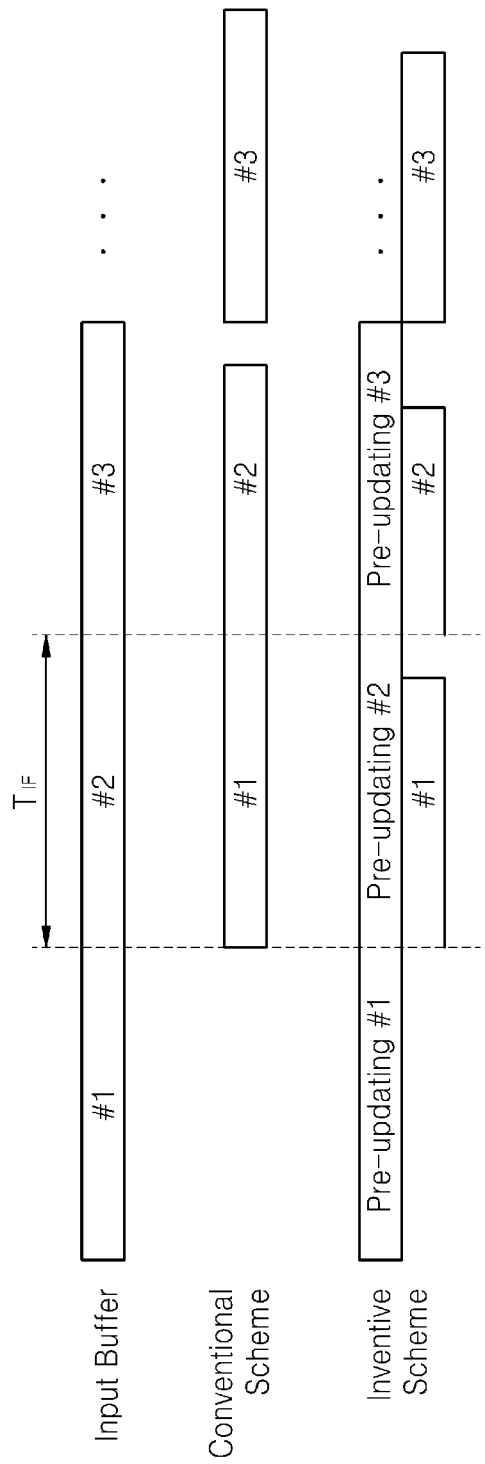
FIG. 10 is a timing diagram comparing decoding schedules for a "conventional decoding scheme" and an "inventive decoding scheme" consistent with certain embodiments of the inventive concept.

FIG. 10 is a timing diagram comparing respective decoding schedules for a conventional decoding scheme and an inventive decoding scheme.

The inventive decoding scheme includes pre-update "while" (i.e., during at least a portion of a period during which) a codeword is being loaded to the input buffer 130-1, as described for the LDPC decoder 130A of FIG. 8 or 130B of FIG. 9. On the other hand, the conventional decoding scheme includes performing of the decoding only after a codeword is completely loaded. That is, the case of the conventional decoding scheme, initialization and first updating are performed in a strictly serial manner.

Referring to FIG. 10, codewords #1, #2, and #3 . . . are sequentially loaded to the input buffer 130-1. the value "$T_{IF}$" represents the time required for loading one codeword in the input buffer 130-1.

As illustrated in FIG. 10, in the case of the conventional decoding scheme, decoding of the codeword #1 begins only after the codeword #1 is loaded to the input buffer 130-1. On the contrary, in case of the inventive decoding scheme pre-update is performed to decode the codeword #1 while the codeword #1 is being loaded to the input buffer 130-1. As described in FIGS. 8 and 9, the pre-update includes performing of an XOR operation of sign information on all variable node connected to each check node and storing the first information, after performing the XOR operation, to the storage unit 130-2B.

Accordingly, in the case of the conventional decoding scheme, it is necessary to load the codeword constantly to the input buffer 130-1 without interruption, and a decoding time budget for performing the decoding meets the condition: ($T_{DEC} \leq T_{IF}$), where "$T_{DEC}$" is a decoding time for one codeword, and "$T_{IF}$" is a time for loading one codeword to the input buffer 130-1.

Additionally, in the case of the inventive decoding scheme it is necessary to constantly load the codeword to the input buffer 130-1 without interruption and a decoding time budget for performing the decoding meets the condition: [$T_{DEC} \leq (T_{IF} + T_{PU})$], where "$T_{PU}$" is a pre-update processing time.

In view of the foregoing, the inventive decoding scheme consistent with embodiments of the inventive concept enables a decoding time budget that more readily allows "on-the-fly processing".

Figure 11:
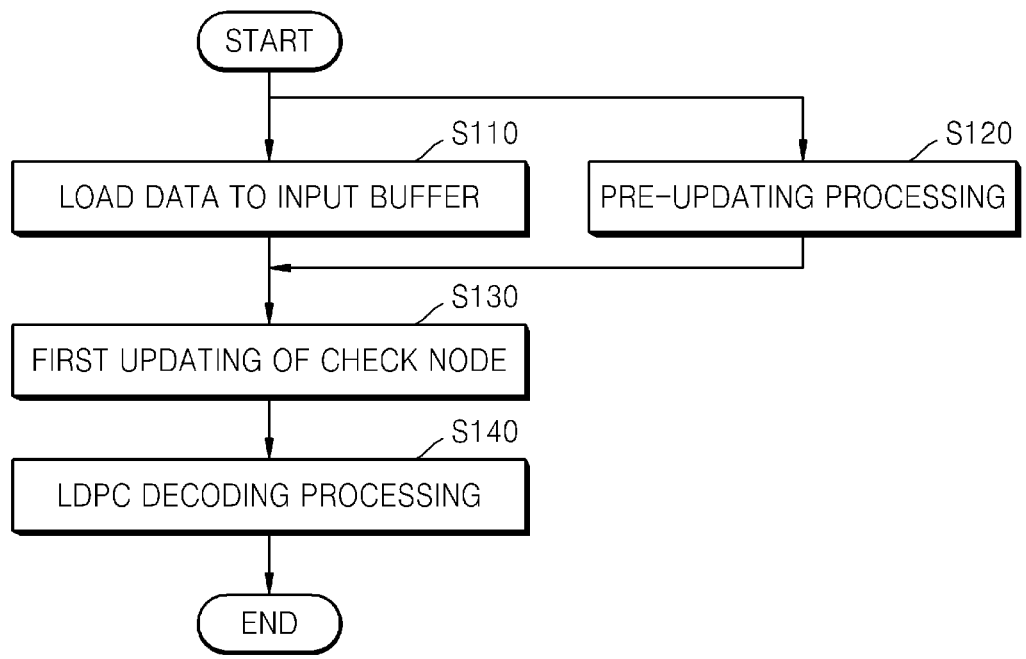
FIG. 11 is a flowchart summarizing a hard-decision decoding method according to an embodiment of the inventive concept.

Next, referring to a flowchart of FIG. 11, a hard-decision decoding method according to an embodiment of the inventive concept will be further described.

As an example, implementation of the method summarized by the flowchart of FIG. 11 by the memory system 1000A of FIG. 1 or by the memory system 1000B of FIG. 2 may be assumed. The flowchart of FIG. 11 may also be implemented for various electronic devices such as server systems, as well as the memory system of FIG. 1 or FIG. 2. Additionally, as an example, the flowchart of FIG. 11 may be implemented for the LDPC decoder 130A of FIG. 8 or 130B of FIG. 9.

The processor 110 controls the memory system 1000A or 1000B in order to load data (S110), which is read from the memory device 200, to the input buffer 130-1 of the LDPC decoder 130A or 130B and decode the data. As an example, the processor 110 may control the memory system 1000A or 1000B in order to load the data to the input buffer 130-1 for each codeword. The data loaded to the input buffer 130-1 is hard-decision information which may be a data value of "0" or "1".

The processor 110 controls the LDPC decoder 130A or 130B in order to perform pre-update while data is being loaded to the input buffer 130-1 (S120). As an example, pre-update may include performing of an operation necessary for first updating of a check node while a codeword is being loaded to the input buffer 130-1. The performing of an operation necessary for the first updating of the check node may include performing of an operation of information necessary for determining a sign of information on the first updating of the check node. Specifically, the information necessary for determining the sign of the information on the first updating of the check node may include first information obtained by performing an XOR operation, for each check node, of sign information of all variable nodes connected to each check node. The first information for the pre-update is stored in the storage unit 130-2B.

Accordingly, as illustrated in FIG. 10, pre-update is performed for decoding the codeword #1, while the codeword #1 is being loaded to the input buffer 130-1.

Next, the processor 110 controls the LDPC decoder 130A or 130B in order to perform first updating of a check node by using a result of the pre-update (S130). As an example, the processor 110 performs first updating of a check node by performing operations necessary for the first updating of the check node of the operation S120.

Next, the processor 110 controls the LDPC decoder 130A or 130B in order to perform LDPC decoding by using a result of the first updating of the check node of the operation S130 (S140).

Figure 12:
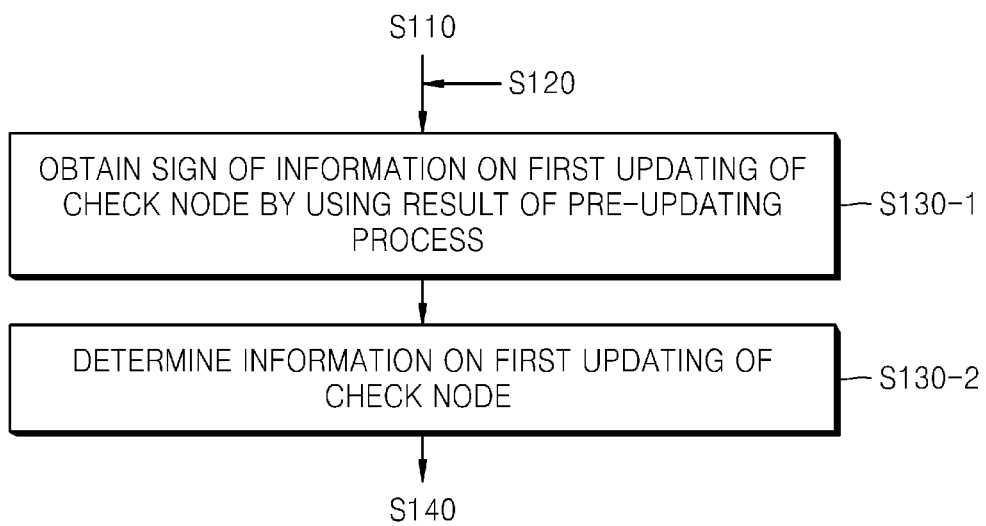
FIG. 12 is a flowchart more particularly describing the step of first updating a check node in the flowchart of FIG. 11.

Now, referring to the flowchart of FIG. 12, an embodiment of a detailed operation of the first updating of the check node of the operation S130 of FIG. 11 will be described.

First, the processor 110 controls the LDPC decoder 130A or 130B in order to obtain sign of information on first updating of a check node by using a result of the pre-update (S130-1). As an example, the sign of the information on the first updating of the check node may be determined as a value obtained by performing an XOR operation of sign information of variable nodes connected to each check node and first information on the corresponding check node, based on the formula for "Lmn" given above. The first information "$\sigma_m$" is information on a result obtained by, for each check node, performing an XOR operation of the sign information, which has been obtained in the operation S120, on all variable nodes connected to each check node. The sign information "$\sigma_{mn}$" on all variable nodes connected to each check node is hard-decision information which corresponds to corresponding variable nodes among hard-decision information of the LDPS decoder 130A or 130B.

Then, the processor 110 controls the LDPC decoder 130A or 130B in order to determine information on the first updating of the check node by using a value obtained by integrating the sign information obtained in operation S130-1 with default magnitude information (S130-2). As an example, information Lmn on the first updating of the check node may be determined by integrating magnitude information [$\alpha \cdot M_I$] on the first updating of the check node with the sign information obtained in S130-1, based on the noted formula for "Lmn".

Figure 13:
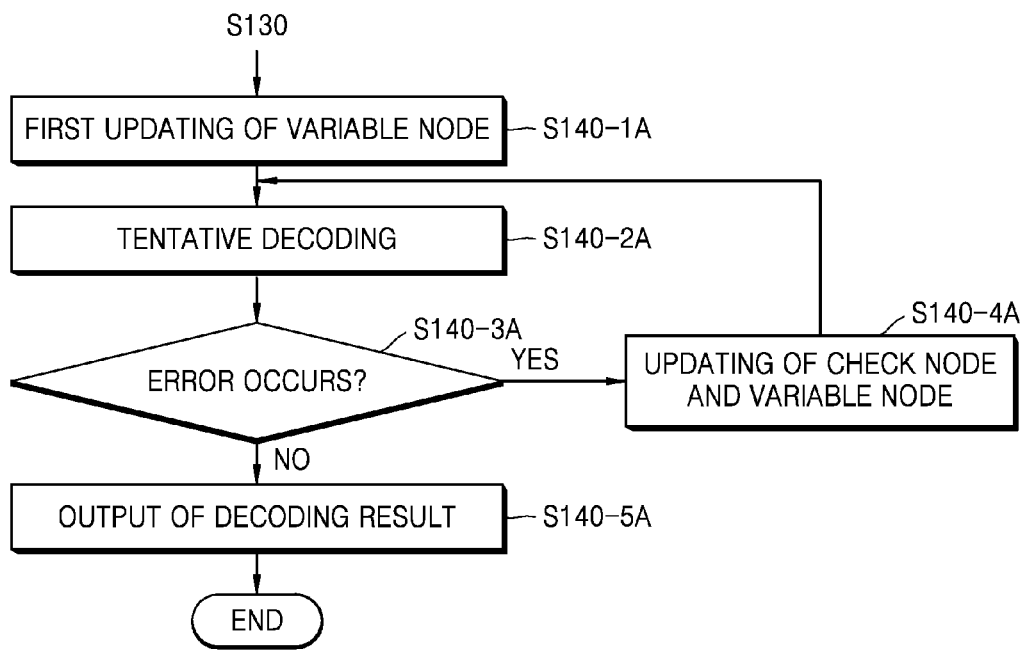
FIG. 13 is a flowchart summarizing one possible approach to the operation of the LDPC decoding of FIG. 11.

Now, referring to a flowchart of FIG. 13, an embodiment of a detailed operation of the LDPC decoding of FIG. 11 will be described.

First, the processor 110 controls the LDPC decoder 130A or 130B in order to perform first updating of a variable node by using a result of the first updating of the check node obtained in operation S130 (S140-1A). As an example, the processor 110 may generate information on first updating of a variable node by performing the operation described above for obtaining "Znm" the using an LLR value which is mapped to information read from the input buffer 130-1 in order to update the variable node, and the information Lmn on the first updating of the check node. As noted above, $F_n$ is an LLR value mapped to information received via a channel which corresponds to a variable node "n".

Next, the processor 110 controls the LDPC decoder 130A or 130B in order to perform tentative decoding based on a result of the updating of the variable node (S140-2A).

Then, the processor 110 controls the LDPC decoder 130A or 130B in order to determine if an error occurs as a result of the tentative decoding (S140-3A). As an example, the processor 110 may determine an error by performing a syndrome check process for a tentative-decoded codeword $\hat{X}$.

If it is determined that an error occurs as a result of the operation S140-3A, the processor 110 controls the LDPC decoder 130A or 130B in order to perform the updating of the check node and the variable node again (S140-4A). As an example, the processor 110 may perform an operation to generate information on updating of a check node, and perform an operation to generate information on updating of a variable node. Accordingly, if an error is determined, the processor 110 sequentially performs second updating of the check node and the variable node.

After completing the operation S140-4A, the processor 110 controls the LDPC decoder 130A or 130B in order to perform tentative decoding again in operation S140-2A.

If it is determined that an error does not occur in operation S140-3A, the processor 110 controls the LDPC decoder 130A or 130B in order to output a tentative-decoded codeword $\hat{X}$ as a decoding result (S140-5A).

Figure 14:
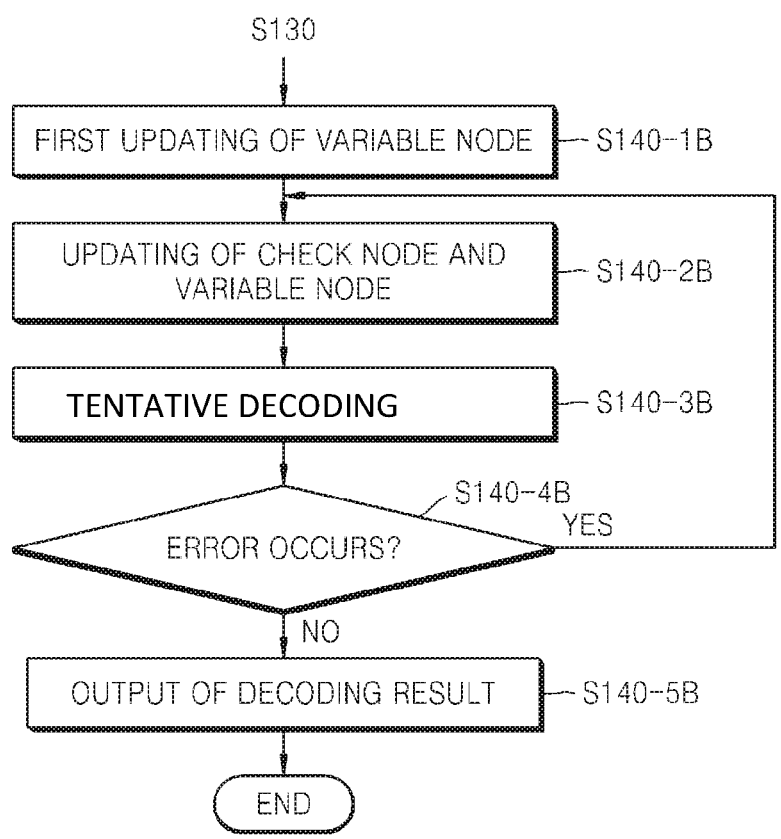
FIG. 14 is a flowchart summarizing another possible approach to the operation of the LDPC decoding of FIG. 11.

Next, referring to a flowchart of FIG. 14, another embodiment of a detailed operation of the LDPC decoding in the operation S140 of FIG. 11 will be described.

First, the processor 110 controls the LDPC decoder 130A or 130B in order to perform first updating of a variable node by using a result of the first updating of the check node obtained in operation S130 (S140-1B).

Then, the processor 110 controls the LDPC decoder 130A or 130B in order to sequentially continue updating of a check node and a variable node starting from second updating (S140-2B). As an example, the processor 110 may perform an operation to generate information on updating of a check node and perform an operation to generate information on updating of a variable node. That is, the processor 110 sequentially performs second updating of the check node and the variable node.

Then, the processor 110 controls the LDPC decoder 130A or 130B in order to perform tentative decoding based on a result of the updating of the variable node (S140-3B).

Then, the processor 110 controls the LDPC decoder 130A or 130B in order to determine if an error occurs as a result of the tentative decoding (S140-4B). As an example, the processor 110 may determine an error by performing a syndrome check process for a tentative-decoded codeword $\hat{X}$.

If an error occurs as a result of determination made in the operation S140-4B, the processor 110 returns to the operation S140-2B and performs the updating of the check node and the variable node again. Accordingly, if an error is determined, the processor 110 sequentially performs third updating of the check node and the variable node.

If an error does not occur as a result of determination made in the operation S140-4B, the processor 110 controls the LDPC decoder 130A or 130B in order to output a tentative-decoded codeword $\hat{X}$ as a decoding result (S140-5B).

Figure 15:
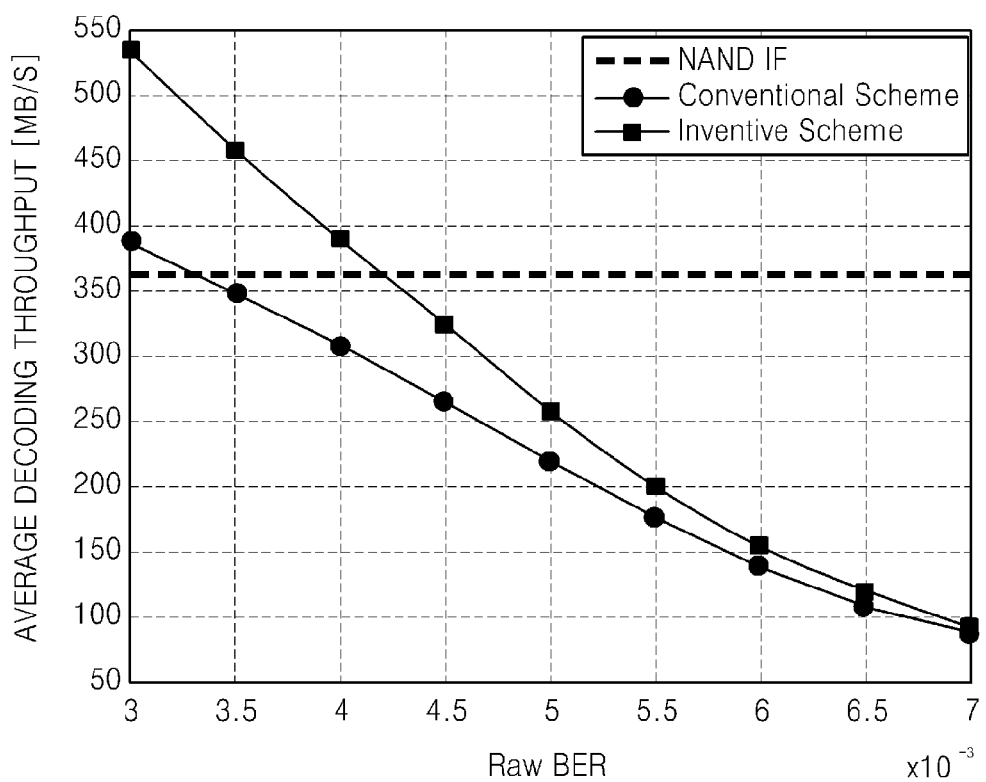
FIG. 15 is a graph correlating average decoding throughput with raw Bit-Error-Rate (BER) for a conventional decoding scheme and an inventive decoding scheme consistent with certain embodiments of the inventive concept.

FIG. 15 is a graph correlating average decoding throughputs with a raw bit-error-rate (BER) for both the conventional decoding scheme and the inventive decoding scheme.

Referring to FIG. 15, in case the memory device 200 is implemented by using a negative and (NAND) flash memory chip, an average throughput (NAND IF), loaded to the input buffer in the memory system, is about 360 MB/S. Accordingly, in order to perform decoding while constantly loading data to the input buffer without interruption, an average decoding throughput need to meet requirements of about 360 MB/S.

Accordingly, as illustrated in FIG. 15, in case of the decoding method proposed in the inventive concept, a range of RBER, which allows on-the-fly processing, increases compared to the normal decoding method.

Figure 16:
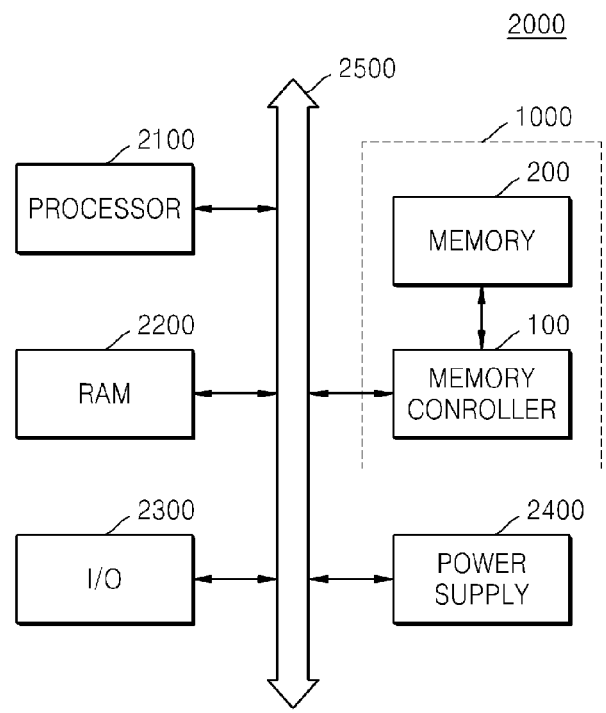
FIG. 16 is a block diagram illustrating an electronic device that may incorporate a memory system according to an embodiment of the inventive concept.

FIG. 16 is a block diagram illustrating an embodiment of an electronic device that uses the memory system according to embodiments of the inventive concept.

Referring to FIG. 16, an electronic device 2000 may include a processor 2100, a random access memory (RAM) 2200, an input/output (I/O) device 2300, a power supply device 2400, and a memory system 1000. The electronic device 2000 may further include ports for communicating with a video card, a sound card, a memory card, a universal serial bus (USB) devices, or other electronic equipment, though not illustrated in FIG. 16. The electronic device 2000 may be implemented by using a personal computer or portable electronic devices such as a notebook computer, a cellular phone, a personal digital assistant (PDA), and a camera.

The memory system 1000A or 1000B of FIG. 1 or 2, according to embodiments of the inventive concept, may be applied to the memory system 1000 of FIG. 16. Accordingly, data read from the memory device 200 may be decoded by applying the decoding method proposed in the inventive concept.

The processor 2100 may perform specific calculations or tasks. According to embodiments, the processor 2100 may be a micro-processor or a central processing unit (CPU). The processor 2100 may communicate with the RAM 2200, the I/O device 2300, and the memory system 1000 via the buses 2500 such as an address bus, a control bus, a data bus, and so on. According to embodiments, the processor 2100 may be connected to an expansion bus such as a peripheral component interconnect (PCI) bus.

The RAM 2200 may store data necessary for operation of the electronic device 2000. For example, the RAM 2200 may be implemented by using a dynamic random access memory (DRAM), a mobile DRAM, a static RAM (SRAM), a phase-change RAM (PRAM), a ferroelectric RAM (FRAM), a resistive RAM (RRAM), and/or a magneto-resistive RAM (MRAM).

The I/O device 2300 may include an input unit such as a keyboard, a keypad, a mouse, and etc. or an output unit such as a printer, a display, and etc. The power supply device 2400 may supply an operating voltage necessary for operating the electronic device 2000.

Figure 17:
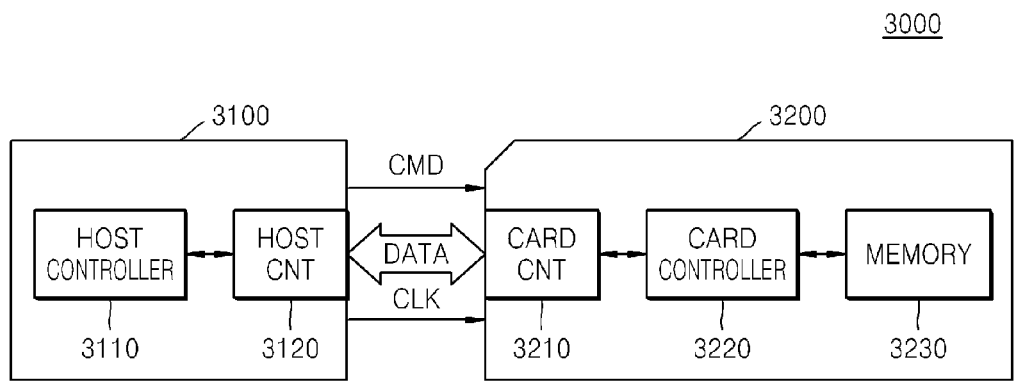
FIG. 17 is a block diagram illustrating a memory card system that may incorporate a memory system according to an embodiment of the inventive concept.

FIG. 17 is a block diagram illustrating a memory card system that includes the memory system according to embodiments of the inventive concept.

Referring to FIG. 17, a memory card system 3000 may include a host 3100 and a memory card 3200. The host 3100 may include a host controller 3110 and a host connector 3120. The memory card 3200 may include a card connector 3210, a card controller 3220, and a memory device 3230.

The memory controller 100 and the memory device 200 or 200' of FIG. 1 or 2 may be applied to the card controller 3220 and the memory device 3230 of FIG. 17.

The host 3100 may write data to the memory card 3200 or read data which is stored in the memory card 3200. The host controller 3110 may transmit a command CMD, a clock signal CLK generated from a clock generator (not illustrated) in the host 3100, and data (DATA) to the memory card 3200 via the host connector 3120.

The card controller 3220 may decode data, which is read from the memory device 3230 in response to a command received via the card connector 3210, by using the decoding method proposed in the inventive concept.

The memory card 3200 may be implemented by using a compact flash card (CFC), a micro-drive, a smart media card (SMC), a multimedia card (MMC), a security digital card (SDC), and a memory stick, and a USB flash memory driver.

Figure 18:
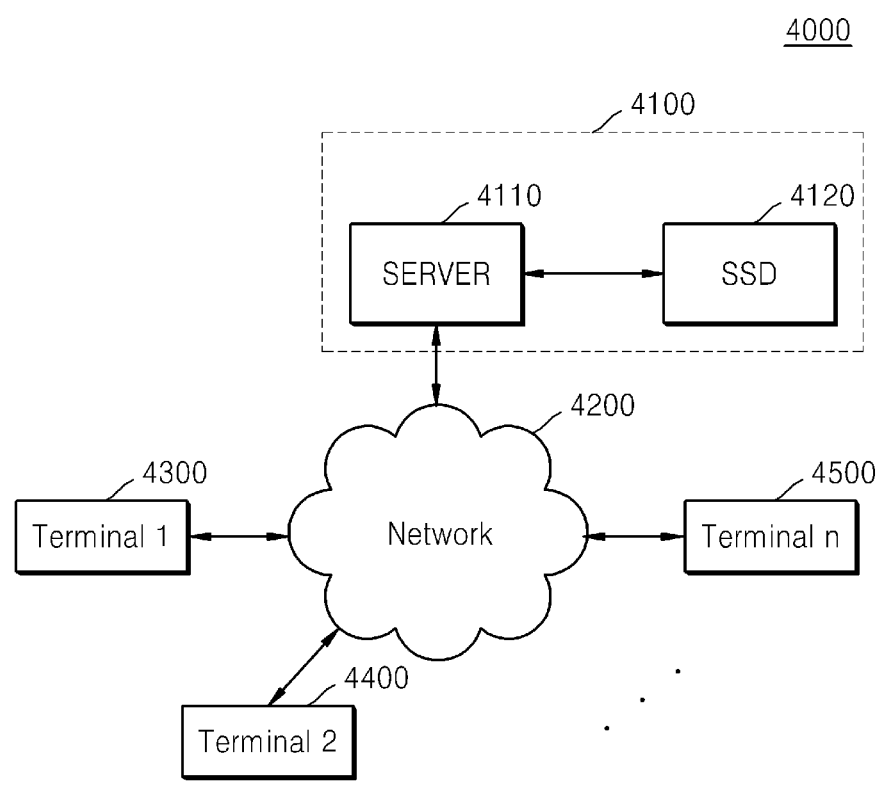
FIG. 18 is a conceptual diagram illustrating a network including a server system that may incorporate a solid state drive (SSD) according to an embodiment of the inventive concept.

FIG. 18 is a block diagram illustrating an exemplary implementation of a network of a server system including a SSD according to embodiments of the inventive concept.

Referring to FIG. 18, a network system 4000 according to an embodiment of the inventive concept may include a server system 4100 and a plurality of terminals 4300, 4400, and 4500 connected via a network 4200. The server system 4100 according to an embodiment of the inventive concept may include a server 4110 for processing a request received from the plurality of terminals 4300, 4400, and 4500, which are connected to the network 4200, and an SSD 4120 for storing data corresponding to a request received from the terminals 4300, 4400, and 4500. The SSD 4120 of FIG. 1 or 2 may be applied to the memory system 1000A or 1000B.

The memory system according to the inventive concept may be mounted by using various types of packages. For example, various types of packages according to the inventive concept may include a package on package (PoP), ball grid arrays (BGAs), chip scale packages (CSPs), plastic leaded chip carrier (PLCC), plastic dual in-line package (PDIP), die-in waffle pack, die-in wafer form, chip on board (COB), a ceramic dual in-line package (CERDIP), a plastic metric-quad flat pack (MQFP), thin quad flat-pack (TQFP), small outline (SOIC), shrink small outline package (SSOP), thin small outline (TSOP), thin quad flat-pack (TQFP), system-in package (SIP), multi-chip package (MCP), wafer-level fabricated package (WFP), wafer-level processed stack package (WSP), and etc.

While the inventive concept has been particularly shown and described with reference to exemplary embodiments thereof, it will be understood by those of ordinary skill in the art that various changes in form and details may be made therein without departing from the scope of the following claims.

What is claimed is:

1. A hard-decision decoding method comprising:
simultaneously performing pre-update operations necessary for a first updating of a check node on data received by a decoder while loading the data received by the decoder to an input buffer;
first updating the check node using a result obtained by the performing of pre-update operations after loading data corresponding to one codeword to the input buffer; and then,
performing low-density parity check (LDPC) decoding using a result obtained by the first updating of the check node,
wherein the first updating of the check node comprises
obtaining sign information for information related to the updating of the first check node based on the result of the performing of pre-update operations necessary for the first updating of the check node, and
determining information for the first updating of the check node using a value obtained by integrating the obtained sign information with default magnitude information, and
wherein the obtaining sign information on the information about the first updating of the check node comprises
determining a sign for the information on the first updating of the check node as a value obtained by performing an XOR operation of sign information of variable nodes connected to each check node and first information on a corresponding check node,
wherein the first information comprises information on a result obtained by performing an XOR operation for each check node for sign information of all variable nodes connected to each check node during the performing of pre-update operations.

2. The method of claim 1, further comprising:
storing information obtained by the performing of pre-update operations necessary for the first updating of the check node in a storage unit.

3. The method of claim 1, wherein the sign information of the variable nodes is hard-decision information corresponding to the variable nodes among hard-decision information which is the data received by the decoder.

4. The method of claim 1, wherein the performing the LDPC decoding using a result obtained by the first updating of the check node comprises:
first updating a variable node using a result of the first updating of the check node; and
performing decoding based on a result of the first updating of the variable node,
wherein upon determining that an error has occurred as a result of the performing of the decoding, the LDPC decoding further comprises again performing of the decoding after repeatedly updating the check node and the variable node.

5. The method of claim 1, wherein the performing the LDPC decoding using a result obtained by the first updating of the check node comprises:
first updating a variable node using the result of the first updating of the check node;
sequentially updating the check node and the variable node; and
performing decoding based on a result of the sequentially updating of the check node and the variable node,
wherein upon determining that an error has occurred as a result of the performing of the decoding, the LDPC decoding comprises again performing of the decoding after repeatedly updating the check node and the variable node.

6. A low-density parity check (LDPC) decoder comprising:
an input buffer that temporarily stores data received by the decoder;
a pre-update processing unit that simultaneously obtains first information necessary for determining a sign of information on first updating of a check node based on sign information on the data received by the decoder, while the data received by the decoder is being loaded to the input buffer;
a first update processing unit that obtains the information on the first updating of the check node using the first information; and
a decoding processing unit that performs LDPC decoding using the information on the first updating of the check node,
wherein the first update processing unit obtains sign information for the information related to the first updating of the check node based on the first information, determines the information for the first updating of the check node using a value obtained by integrating the obtained sign information with default magnitude information, and obtains the sign information on the information about the first updating of the check node by determining a sign for the information on the first updating of the check node as a value obtained by performing an XOR operation of sign information of variable nodes connected to each check node and the first information on a corresponding check node, and
wherein the pre-update processing unit obtains the first information by performing an XOR operation for each check node for sign information of all variable nodes connected to each check node during performing of pre-update operations.

7. The LDPC decoder of claim 6, wherein the pre-update processing unit comprises:
an exclusive-OR (XOR) operation unit that generates the first information by performing the XOR operation for each check node for the sign information on all the variable nodes connected to each check node while the data received by the decoder is loaded to the input buffer; and
a storage unit that stores the first information obtained by performing the XOR operation for each check node at the XOR operation unit.

8. The LDPC decoder of claim 6, wherein the data received by the decoder is information read from a memory device.

9. The LDPC decoder of claim 6, wherein the decoding processing unit comprises:
a mapping processing unit that generates a default log-likelihood ratio (LLR) value corresponding to data read from the input buffer;
a second update processing unit that generates information on first updating of a variable node by using the LLR value generated from the mapping processing unit and the information on the first updating of the check node, and responsive to an error determination signal, sequentially generates information on updating of the check node and the variable node; and
a tentative decoding unit for tentative decoding based on a result of the updating performed at the second update processing unit, wherein the decoding processing unit generates the error determination signal responsive to occurrence of an error as a result of the tentative decoding.

10. A memory system comprising:
a nonvolatile memory device; and
a memory controller that controls overall operation of the nonvolatile memory device, wherein the memory controller comprises a processor and a low-density parity check (LDPC) decoder that cooperatively operate to obtain data stored in the nonvolatile memory device,
the LDPC decoder comprising:
an input buffer that temporarily stores data received by the decoder,
a pre-update processing unit that simultaneously obtains first information necessary for determining a sign of information on first updating of a check node based on sign information on the data received by the decoder, while the data received by the decoder is being loaded to the input buffer,
a first update processing unit that obtains the information on the first updating of the check node using the first information, and
a decoding processing unit that performs LDPC decoding using the information on the first updating of the check node,
wherein the first update processing unit obtains sign information for the information related to the first updating of the check node based on the first information, determines the information for the first updating of the check node using a value obtained by integrating the obtained sign information with default magnitude information, and obtains the sign information on the information about the first updating of the check node by determining a sign for the information on the first updating of the check node as a value obtained by performing an XOR operation of sign information of variable nodes connected to each check node and the first information on a corresponding check node, and
wherein the pre-update processing unit obtains the first information by performing an XOR operation for each check node for sign information of all variable nodes connected to each check node during performing of pre-update operations.

11. The memory system of claim 10, wherein the memory controller further comprises a host interface implementing a data communications protocol with a host.

12. The memory system of claim 10, wherein the nonvolatile memory device comprises at least one flash memory chip.

13. The memory system of claim 10, wherein the nonvolatile memory device is a solid state drive (SSD).

* * * * *